United States Patent
Liu

(10) Patent No.: US 10,643,709 B2
(45) Date of Patent: May 5, 2020

(54) METHODS AND OPERATING A 3D MEMORY DEVICE

(71) Applicant: Yangtze Memory Technologies Co., Ltd., Wuhan, Hubei (CN)

(72) Inventor: Jun Liu, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/126,288

(22) Filed: Sep. 10, 2018

(65) Prior Publication Data
US 2020/0058358 A1 Feb. 20, 2020

Related U.S. Application Data

(63) Continuation of application No. PCT/CN2018/100445, filed on Aug. 14, 2018.

(51) Int. Cl.
*G11C 16/04* (2006.01)
*G11C 16/14* (2006.01)
(Continued)

(52) U.S. Cl.
CPC .......... *G11C 16/14* (2013.01); *G11C 16/0483* (2013.01); *H01L 27/1157* (2013.01); *H01L 27/11582* (2013.01)

(58) Field of Classification Search
CPC .................................................... G11C 16/16
(Continued)

(56) References Cited

U.S. PATENT DOCUMENTS 8,873,294 B2  10/2014  Shim et al.
9,786,375 B2  10/2017  Goda et al.
(Continued)

FOREIGN PATENT DOCUMENTS

CN   102467965 A   5/2012
CN   105575431 A   5/2016
(Continued)

OTHER PUBLICATIONS

International Search Report and Written Opinion of the International Searching Authority directed to related International Patent Application No. PCT/CN2018/100445, dated May 15, 2019; 10 pages.

*Primary Examiner* — Min Huang
(74) *Attorney, Agent, or Firm* — Sterne, Kessler, Goldstein & Fox P.L.L.C.

(57) ABSTRACT

Embodiments of three-dimensional memory device architectures and methods of operating the devices therefore are disclosed. A method of erasing memory cells of a memory device includes applying a first voltage greater than 10 V to a first semiconductor layer of one or more first vertical structures. The method further includes applying a second voltage greater than 10 V to a second semiconductor layer of one or more second vertical structures stacked over the one or more first vertical structures. The method also includes grounding each of a plurality of word lines. The plurality of word lines are arranged in an alternating stack with insulating layers over a substrate, and the one or more first vertical structures and the one or more second vertical structures extend through the alternating stack.

19 Claims, 15 Drawing Sheets

(51) Int. Cl.
*H01L 27/11582* (2017.01)
*H01L 27/1157* (2017.01)

(58) Field of Classification Search
USPC .................................................... 365/185.11
See application file for complete search history.

(56) References Cited

U.S. PATENT DOCUMENTS

| | | | |
|---|---|---|---|
| 10,347,339 B2 | 7/2019 | Park | |
| 2011/0199825 A1* | 8/2011 | Han | G11C 16/10 365/185.11 |
| 2014/0136765 A1* | 5/2014 | Oh | G11C 16/0483 711/103 |
| 2016/0314833 A1* | 10/2016 | Lee | G11C 11/5635 |
| 2017/0076805 A1* | 3/2017 | Goda | G11C 16/16 |
| 2019/0102104 A1* | 4/2019 | Righetti | G06F 3/0653 |

FOREIGN PATENT DOCUMENTS

| | | |
|---|---|---|
| CN | 107851455 A | 3/2018 |
| CN | 108122584 A | 6/2018 |
| WO | WO 2016069487 A1 | 5/2016 |
| WO | WO 2017052700 A1 | 3/2017 |

* cited by examiner

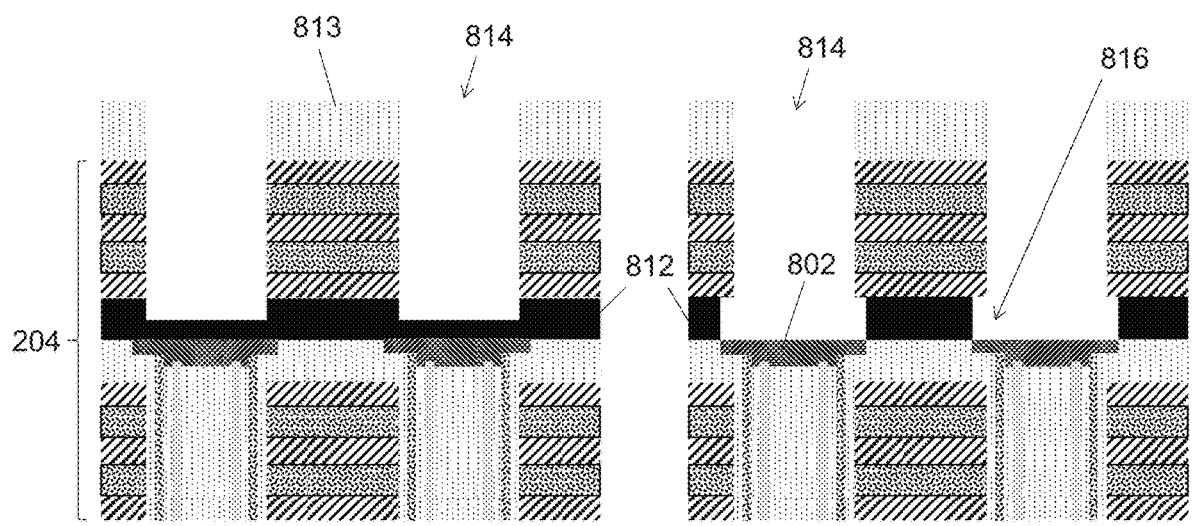

METHODS AND OPERATING A 3D MEMORY DEVICE

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and methods of operating the devices therefore are disclosed herein. The disclosed structures and methods provide improved erase operations to ensure that all memory cells along 3D NAND memory strings are adequately erased.

In some embodiments, a memory device includes one or more first vertical structures and one or more second vertical structures, the one or more second vertical structures aligned over corresponding ones of the one or more first vertical structures, and a conductive material disposed between the one or more first vertical structures and the one or more second vertical structures. A method of erasing memory cells of the memory device includes applying a first voltage greater than 10 V to a first semiconductor layer of the one or more first vertical structures. The method further includes applying a second voltage greater than 10 V to a second semiconductor layer of the one or more second vertical structures. The method also includes grounding each of a plurality of word lines. The plurality of word lines are arranged in an alternating stack with insulating layers over a substrate, and the one or more first vertical structures and the one or more second vertical structures extend through the alternating stack.

In some embodiments, applying the first voltage includes applying a voltage between 12 V and 27 V.

In some embodiments, applying the second voltage includes applying a voltage between 12 volts and 27 volts.

In some embodiments, applying the second voltage includes applying the second voltage to a conductive material disposed at a top portion of the one or more second vertical structures, the conductive material being in conductive contact with the second semiconductor layer.

In some embodiments, applying the first voltage includes applying the first voltage to the substrate.

In some embodiments, the method further includes applying a third voltage to a select gate disposed above the plurality of word lines.

In some embodiments, the third voltage is between 3 V and 7 V.

In some embodiments, applying the first voltage includes applying the first voltage to a conductive contact that extends through the alternating stack and abuts a doped portion of the substrate.

In some embodiments, the first current flows towards the plurality of word lines after flowing through the channel layer of the one or more first vertical structures.

In some embodiments, the second current flows towards the plurality of word lines after flowing through the channel layer of the one or more second vertical structures.

In some embodiments, a memory device includes one or more first vertical structures and one or more second vertical structures, the one or more second vertical structures aligned over corresponding ones of the one or more first vertical structures, and a conductive material disposed between the one or more first vertical structures and the one or more second vertical structures. A method of erasing memory cells of the memory device includes applying a voltage greater than 10 V to a first semiconductor layer of the one or more first vertical structures. Charges in the first semiconductor layer tunnel through the conductive material to reach a second semiconductor layer of the one or more second vertical structures. The method also includes grounding each of a plurality of word lines. The plurality of word lines are arranged in an alternating stack with insulating layers over a substrate, and the one or more first vertical structures and the one or more second vertical structures extend through the alternating stack.

In some embodiments, applying the voltage includes applying a voltage between 12 V and 27 V.

In some embodiments, applying the voltage includes applying the voltage to the substrate.

In some embodiments, applying the voltage includes applying the voltage to a conductive contact that extends through the alternating stack and abuts a doped portion of the substrate.

In some embodiments, a thickness of the conductive material is between 15 nm and 45 nm.

In some embodiments, the conductive material is doped with n-type dopants at a concentration of at least $10^{19}$.

In some embodiments, applying the voltage causes a current to flow through the channel layer of the one or more first vertical structures and the channel layer of the one or more second vertical structures.

In some embodiments, the current flows towards the plurality of word lines after flowing through the channel layer of the one or more first vertical structures or the channel layer of the one or more second vertical structures.

Erase operations are disclosed that more effectively erase all memory cells of the three-dimensional memory devices provided by the present disclosure. Such erase operations may be used in memory devices that utilize a stacked NAND string configuration with a conductive material present between the NAND strings. Conventional erase methods may not adequately erase all memory cells due to the presence of the conductive material.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

FIGS. 8A-8F illustrate side views of a three-dimensional memory structure at different stages of an exemplary fabrication process, according to a third embodiment.

DETAILED DESCRIPTION

Figure 1:
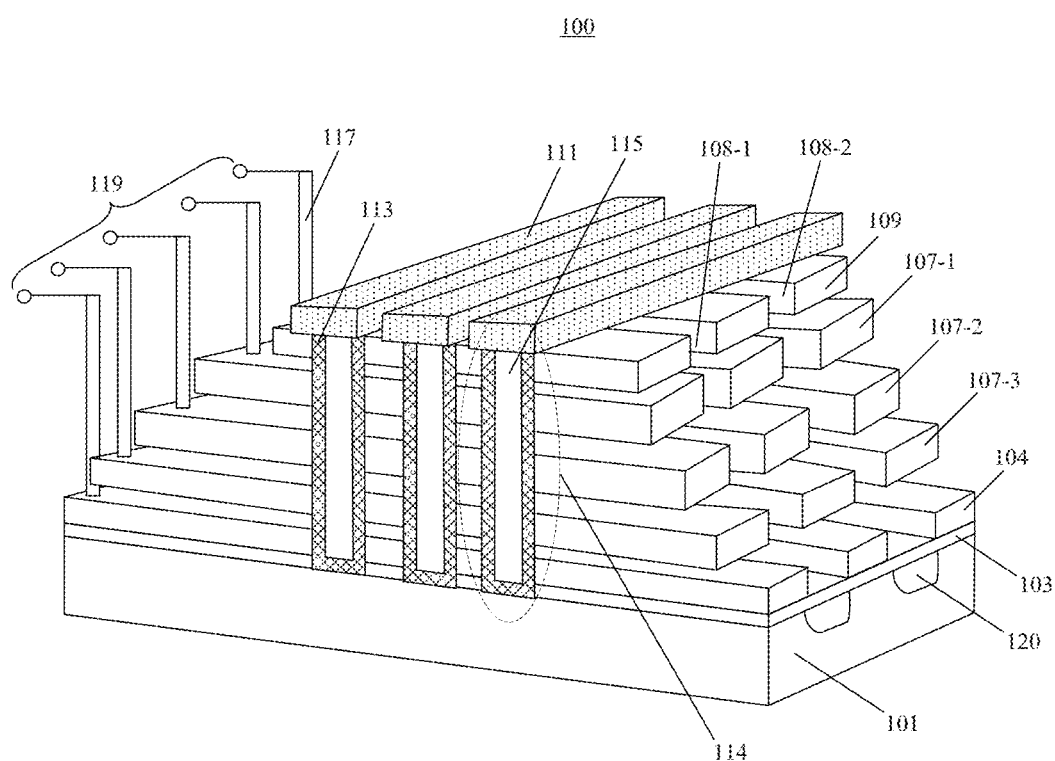
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity, but are discussed in more detail with reference to later figures.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. Although using three-dimensional NAND devices as examples, in various applications and designs, the disclosed structures can also be applied in similar or different semiconductor devices to, e.g., reduce the number of metal connections or wiring. The specific application of the disclosed structures should not be limited by embodiments of the present disclosure. For illustrative purposes, word lines and gate electrodes are used interchangeably to describe the present disclosure.

Figure 2:
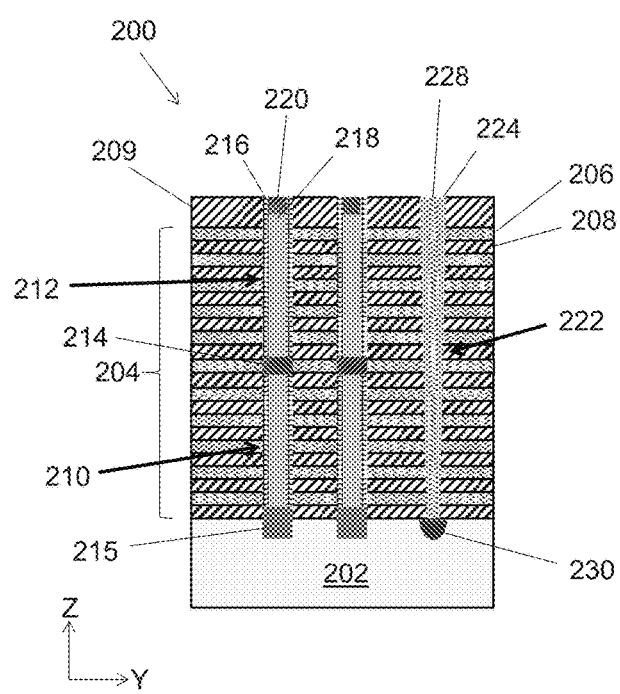
FIG. 2 illustrates a side view of a three-dimensional memory structure, according to some embodiments.

FIG. 2 illustrates an exemplary three-dimensional memory device 200, according to some embodiments. Other parts of memory device 200 are not shown for ease of description. In some embodiments, memory device 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIG. 2, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOI), glass, gallium nitride, gallium arsenide, and/or other suitable compound.

In some embodiments, an alternating conductor/insulator layer stack 204 is formed over substrate 202. Layer stack 204 includes conductive layers 206 alternating with insulator layers 208. Example thicknesses of conductor layers 206 or insulator layers 208 can range from 20 nm to 500 nm. In some embodiments, a dielectric material 209 is deposited over layer stack 204. Dielectric material 209 can have the same material composition as insulator layers 208. Insulator layers 208 can be silicon oxide, silicon nitride, silicon oxynitride, or any combination thereof. Conductive layers 206 can include conductor materials including, but not limited to, W, Co, Cu, Al, doped silicon, silicides, or any combination thereof. Although only 22 total layers are illustrated in layer stack 204, it should be understood that this is for illustrative purposes only and that any number of layers may be included in layer stack 204. According to some embodiments, conductive layers 206 act as word lines for the memory device.

In some embodiments, a plurality of first vertical structures 210 are formed through a lower portion of layer stack 204 and extending down to an epitaxially grown material 215. Epitaxially grown material 215 can include epitaxially grown silicon, and may extend into a portion of substrate 202. A plurality of second vertical structures 212 is formed over corresponding ones of plurality of first vertical structures and extending through an upper portion of layer stack 204. Plurality of first vertical structures 210 and plurality of second vertical structures 212 include a deposited conductive material 214 between them. Various embodiments for the fabrication of conductive material 214 are provided herein with reference to FIGS. 6-8.

Plurality of first vertical structures 210 and plurality of second vertical structures 212 can be NAND strings that each include a plurality of memory layers 216 and a core insulator 218 (only labeled for plurality of second vertical structures 212 in FIG. 2.) Plurality of memory layers 216 can include a semiconductor channel layer, such as amorphous silicon, polysilicon, or single crystalline silicon. Plurality of memory layers 216 can also include a tunneling layer, a storage layer (also known as "charge trap/storage layer"), and a blocking layer. The blocking layer, the storage layer, the tunneling layer, and the semiconductor channel layer are arranged over one another on the sidewalls in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 216 includes silicon oxide/silicon nitride/silicon oxide (ONO) dielectrics (e.g., a tunneling layer including silicon oxide, a storage layer including silicon nitride, and a blocking layer including silicon oxide). Core insulator 218 can be any dielectric material, such as oxide, for example. A diameter of first vertical structures 210 or second vertical structures 212 can be between about 100 nm and 200 nm.

In some embodiments, a top portion of second vertical structures 212 is recessed and filled with a conductive material 220. Conductive material 220 can include polysilicon and can be doped to increase its conductivity.

According to some embodiments, memory device 200 also includes a conductive contact 222 that extends through layer stack 204 down to substrate 202. Conductive contact 222 can include a blocking layer 224 and a core conductor 228. Blocking layer 224 can include oxide, or any other electrically insulating material. Core conductor 228 can include a metal, such as tungsten, or any other conductive material such as Co, Cu, Al, doped silicon, silicides, or any combination thereof, to name a few examples. According to some embodiments, conductive contact extends down to a doped region 230 within substrate 202. Doped region 230 can be implanted with n-type or p-type dopants to increase the conductivity of doped region 230. In some embodiments, core conductor 228 includes an inner insulating layer that may include undoped polysilicon or oxide.

Figure 3:
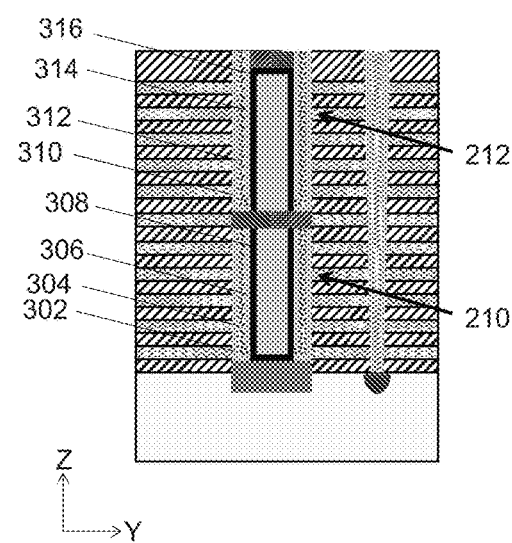
FIG. 3 illustrates a more detailed side view of the three-dimensional memory structure, according to some embodiments.

FIG. 3 illustrates a more detailed cross-section view of memory device 200 showing the various layers of memory layers 216. Accordingly, the memory layers of first vertical structures 210 include a blocking layer 302, a storage layer 304, a tunneling layer 306, and a semiconductor channel layer 308. In some embodiments, blocking layer 302 and tunneling layer 306 are both silicon oxide, storage layer 304 is silicon nitride, and semiconductor channel layer 308 is polysilicon. Similarly, the memory layers of second vertical structures 212 include a blocking layer 310, a storage layer 312, a tunneling layer 314, and a semiconductor channel layer 316. In some embodiments, blocking layer 310 and tunneling layer 314 are both silicon oxide, storage layer 312 is silicon nitride, and semiconductor channel layer 316 is polysilicon.

Figure 4A:
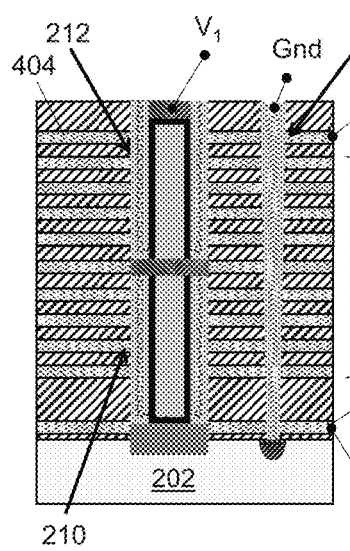
FIGS. 4A-4C illustrate example operations performed on the three-dimensional memory structure, according to some embodiments.
Figure 4B:
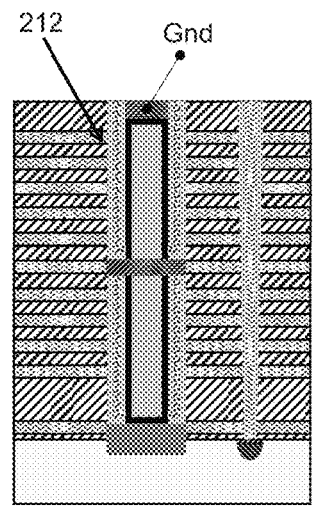
Figure 4C:
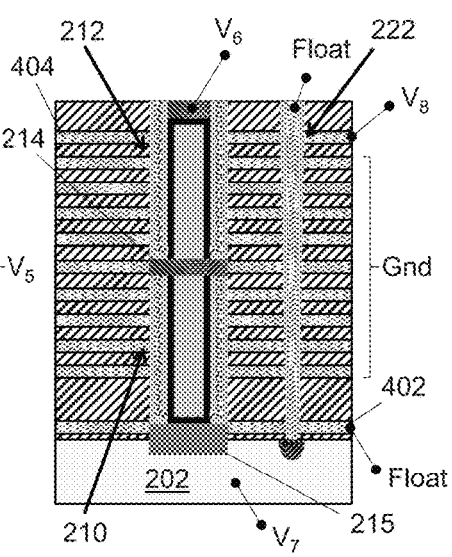

FIGS. 4A-4C illustrate read, program, and erase operations performed on memory device 200, according to some embodiments. FIG. 4A illustrates an example read operation being performed. A voltage V1 is applied to a top conductive material of second vertical structures 212. Voltage $V_1$ can range from 0.2 V to 1.0 V. In one example, first voltage $V_1$ is about 0.5 V. Another voltage $V_2$ is applied to a bottom conductive layer 402 that acts as a bottom select gate (BSG) for memory device 200. Second voltage $V_2$ can range from 3 V to 7 V. In one example, second voltage $V_2$ is about 5 V.

A voltage $V_3$ is applied to one or more word lines (e.g., the conductive layers 206 of layer stack 204.) Each of the one or more word lines can receive a voltage that ranges from 3 V to 7 V. In one example, voltage $V_3$ is about 5 V. Another voltage $V_4$ is applied to a top conductive layer 404 that acts a top select gate (TSG) for memory device 200. Voltage $V_4$ can range from 3 V to 7 V. In one example, voltage $V_4$ is about 5 V.

Conductive contact 222 is grounded. In some embodiments, substrate 202 is grounded instead. By applying voltage $V_1$ to the top of second vertical structures 212 and grounding substrate 202 via conductive contact 222, current flows from the semiconductor channel layers of second vertical structures 212 to the semiconductor channel layers of first vertical structures 210 and further into conductive contact 222 via substrate 202. Voltage $V_3$ is then applied to a given word line to read from that word line as either a logic '0' or a logic '1'.

FIG. 4B illustrates an example program operation being performed. A top conductive material of second vertical structures 212 is grounded while a high voltage $V_5$ is applied to one or more word lines to program the one or more word lines. Voltage $V_5$ can range from 10 V to 20 V. In one example, voltage $V_5$ is about 15 V. The high current applied to a given memory cell drives charge into the charge trap layer, thus setting the memory bit to a logic '1'.

FIG. 4C illustrates an example erase operation being performed, according to an embodiment. A voltage $V_6$ is applied to a top conductive material of second vertical structures 212. Voltage $V_6$ can be greater than 10 V. In some embodiments, voltage $V_6$ ranges from 12 V to 27 V. In one example, voltage $V_6$ is about 15 V. Applying voltage $V_6$ to the top conductive material of second vertical structures 212 also applies the voltage to the semiconductor channel layer of second vertical structures 212 since the semiconductor channel layer of second vertical structures 212 is in conductive contact with the top conductive material.

Another voltage $V_7$ is applied to substrate 202, although in some embodiments, voltage $V_7$ can also be applied to conductive contact 222. Applying voltage $V_7$ to substrate 202 or conductive contact 222 also applies the voltage to the semiconductor channel layer of first vertical structures 210 via the conductive epitaxially grown material 215. Voltage $V_7$ can be greater than 10 V. In some embodiments, voltage $V_7$ ranges from 12 V to 27 V. In one example, voltage $V_7$ is about 15 V.

A voltage $V_8$ is applied to top conductive layer 404. Voltage $V_8$ can range from 3 V to 7 V. In one example, voltage $V_8$ is about 5 V. Bottom conductive layer 402 is left floating (e.g., no voltage is applied) and conductive contact 222 can either be left floating, or have voltage $V_7$ applied. Each of the word lines are grounded.

By applying high voltage on either ends of the vertical structures and grounding the word lines, holes are driven into the charge trap layers of both first vertical structures 210 and second vertical structures 212, thus "erasing" the memory cells of any negative charges trapped there. High voltage is applied separately to both first vertical structures 210 and second vertical structures 212 because the hole current does not flow effectively through conductive material 214 disposed between first vertical structures 210 and second vertical structures 212. Thus, according to some embodiments, a first hole current flows through the semiconductor channel layer of first vertical structures 210, and a second hole current flows through the semiconductor channel layer of second vertical structures 212. The first hole current and the second hole current each flow towards the word lines after flowing through the semiconductor channel layer of first vertical structures 210 and the semiconductor channel layer of second vertical structures 212, respectively, according to some embodiments.

Figure 5:
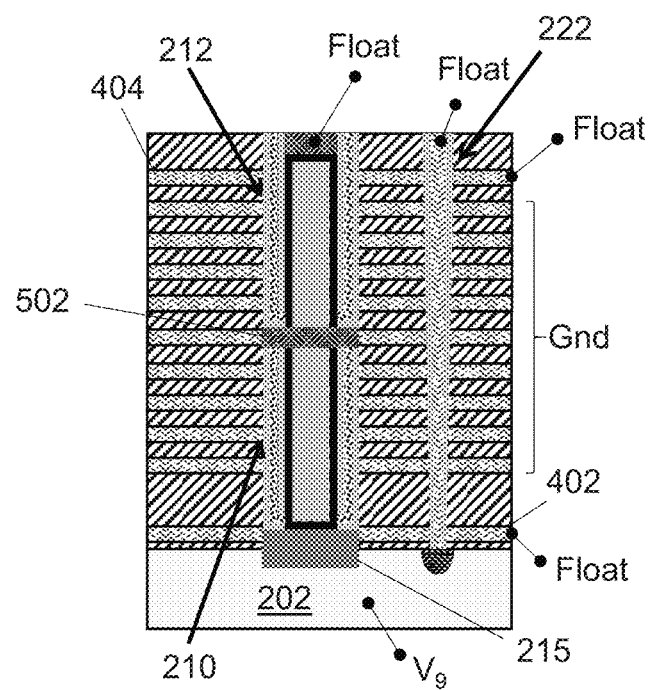
FIG. 5 illustrates another example operation performed on the three-dimensional memory structure, according to some embodiments.

FIG. 5 illustrates another example erase operation being performed, according to an embodiment. A voltage $V_9$ is applied to substrate 202, although in some examples, voltage $V_9$ is applied to conductive contact 222. Applying voltage V9 to substrate 202 or conductive contact 222 also applies the voltage to the semiconductor channel layer of first vertical structures 210 via the conductive epitaxially grown material 215. Voltage $V_9$ can be greater than 10 V. In some embodiments, voltage $V_9$ ranges from 12 V to 27 V. In one example, voltage $V_9$ is about 15 V.

The top conductive contact of second vertical structures 212, bottom conductive layer 402, and the top conductive layer 404 are all left floating. Conductive contact 222 can be left floating or have voltage $V_9$ applied to it. Each of the word lines are grounded.

The holes generated within the semiconductor channel layer of first vertical structures 210 can tunnel through conductive material 502 to reach the semiconductor channel layer of second vertical structures 212, according to some embodiments. In order to facilitate the tunneling of the holes through the material, conductive material 502 can be made to be thin, such as between 15 nm and 45 nm, and be heavily doped, such as having a doping concentration greater than $10^{19}$. The dopants used in conductive material 502 can be n-type dopants such as phosphorous. The hole current that flows between first vertical structures 210 and second vertical structures 212 flows towards the word lines after flowing through the semiconductor channel layer of first vertical structures 210 or the semiconductor channel layer of second vertical structures 212, according to some embodiments.

FIGS. 6-8 illustrate fabrication processes for forming conductive material 214 or 502 between first vertical structures 210 and second vertical structures 212, according to some embodiments.

Figure 6A:
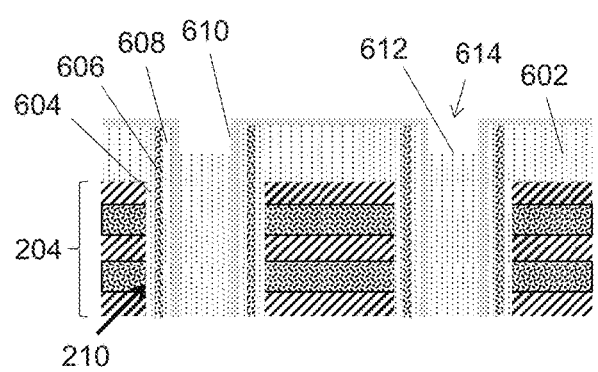
FIGS. 6A-6F illustrate side views of a three-dimensional memory structure at different stages of an exemplary fabrication process, according to a first embodiment.

FIGS. 6A-6F illustrate cross sections of a semiconductor structure during a fabrication process, according to some embodiments. FIG. 6A illustrates first vertical structures 210 extending through layer stack 204 and having a plurality of memory layers including a first oxide layer 604, a nitride layer 606, a second oxide layer 608, and a semiconductor layer 610. In some embodiments, first oxide layer 604 acts as a blocking layer, nitride layer 606 acts as a storage layer, second oxide layer 608 acts as a tunneling layer, and semiconductor layer 610 acts as a channel layer through which current can flow. Semiconductor layer 610 can be polysilicon. In some embodiments, a top dielectric layer 602 is disposed over layer stack 204.

According to some embodiments, a core insulator 612 of first vertical structures 210 is etched back to form recesses 614. Core insulator 612 can include oxide and be etched using various wet etchants known for etching oxide, such as buffered oxide etch (BOE) or hydrofluoric acid.

Figure 6B:
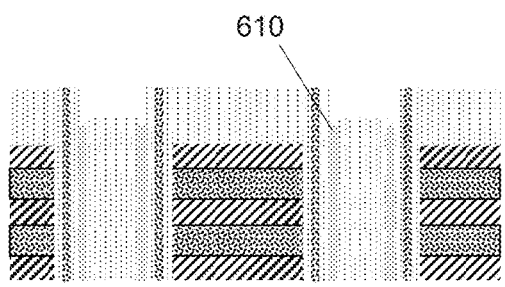

FIG. 6B illustrates a process of removing exposed portions of semiconductor layer 610 using known wet etchants. In some embodiments, semiconductor layer 610 is etched such that it is recessed below a top surface of core insulator 612.

Figure 6C:
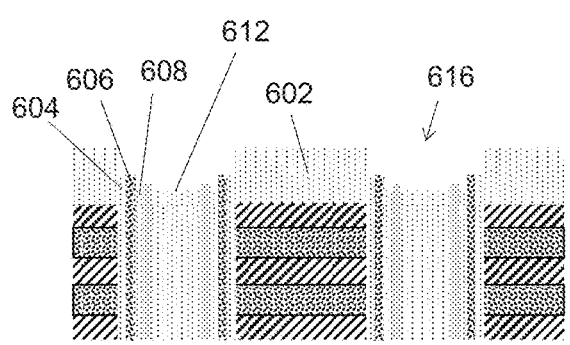

FIG. 6C illustrates one or more etching processes being performed to etch each of first oxide layer 604, nitride layer 606, and second oxide layer 608, according to some embodiments. The etching process also further etches core insulator 612 and laterally etches into top dielectric layer 602. Different etchants may be required for etching the various memory layers. For example, nitride layer 606 can be etched using phosphoric acid while each of first oxide layer 604 and second oxide layer 608 can be etched using BOE or hydrofluoric acid. A top surface of top dielectric layer 602 can be protected from the etching using a mask layer (not shown). The result of the etching processes yields a wider recess 616 at the top portions of first vertical structures 210.

Figure 6D:
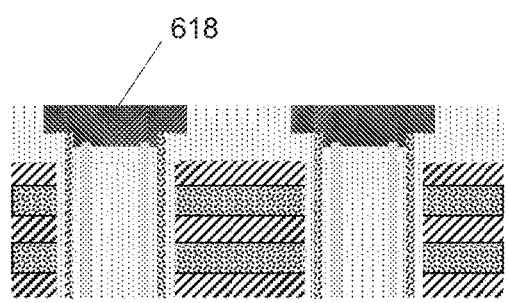

FIG. 6D illustrates the deposition of a conductive material 618 within recesses 616, according to some embodiments. Conductive material 618 can be polysilicon. A CMP procedure can be performed to planarize a top surface of conductive material 618. In some embodiments, dopants are implanted within conductive material 618 using a well-known ion implantation technique. The dopants may be any n-type or p-type dopants to further increase the conductivity of conductive material 618.

Figure 6E:
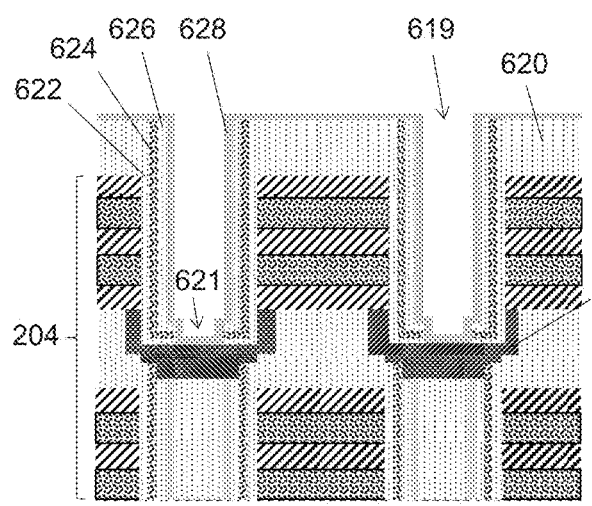

FIG. 6E illustrates the formation of additional layers of layer stack 204. In some embodiments, a top dielectric layer 620 is also formed over layer stack 204. Openings 619 are formed through a top portion of layer stack 204 and through a portion of conductive material 618. Openings 619 can be formed using deep reactive ion etching (DRIE).

Memory layers of second vertical structures 212 are deposited within openings 619. For example, a first oxide layer 622, a nitride layer 624, a second oxide layer 626, and a semiconductor layer 628 are deposited, in the order listed, within openings 619. In order to ensure that semiconductor layer 628 makes a conductive contact with conductive material 618, another etch can be performed through each of the memory layers at the bottom of openings 619 to form nested recess 621, and semiconductor layer 628 is stripped away and re-deposited within nested recess 621, according to some embodiments.

Figure 6F:
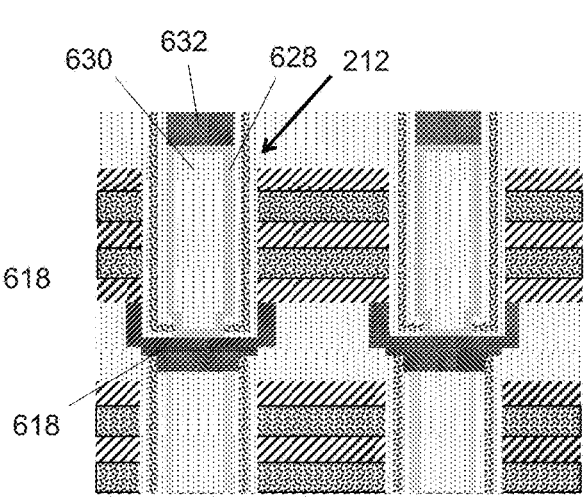

FIG. 6F illustrates the completion of the formation of second vertical structures 212, according to some embodiments. Specifically, a core insulator 630 is deposited to fill a remainder of openings 619, and subsequently recessed to provide space for depositing a top conductive material 632. Top conductive material 632 can include polysilicon. In some embodiments, top conductive material 632 is the same material as semiconductor layer 628. According to some embodiments, a bottom portion of second vertical structures 212 is surrounded by conductive material 618. Top conductive material 632 can be similarly doped as described above with respect to conductive material 618. In some embodiments, the dopants that are either diffused or implanted into top conductive material 632 do not extend through the entire thickness of top conductive material 632.

According to some embodiments, dopants from top conductive material 632 and conductive material 618 can diffuse into adjacent portions of semiconductor layer 628 of second vertical structures 212 and semiconductor layer 610 of first vertical structures 210. The diffusion may be aided by annealing the semiconductor structure at a high temperature between 750 and 950° C., for about 30 minutes.

Figures 7A, 7B:
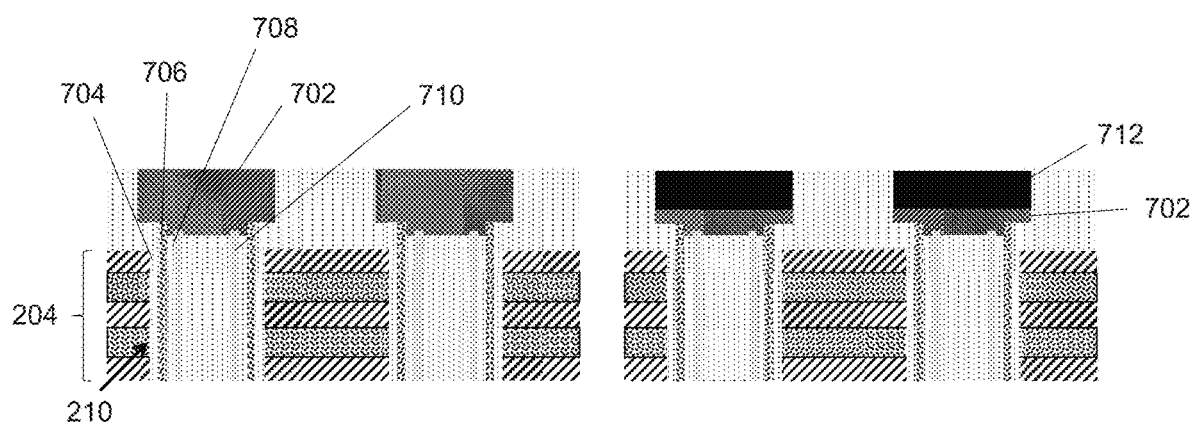
FIGS. 7A-7F illustrate side views of a three-dimensional memory structure at different stages of an exemplary fabrication process, according to a second embodiment.

FIGS. 7A-7F illustrate cross sections of a semiconductor structure during a fabrication process, according to a second embodiment. FIG. 7A illustrates first vertical structures 210 extending through layer stack 204 and having a plurality of memory layers including a first oxide layer 704, a nitride layer 706, a second oxide layer 708, and a semiconductor layer 710. FIG. 7A illustrates a fabrication stage similar to that illustrated in FIG. 6D, and thus each of the operations discussed from FIG. 6A-6D are similarly performed to form a conductive material 702 filling recesses at the top portions of first vertical structures 210. Conductive material 702 can be polysilicon, and may have properties similar to that of conductive material 618 described in FIGS. 6D-6F.

FIG. 7B illustrates the removal of a top portion of conductive material 702 to form recesses that are subsequently filled with insulating material 712, according to some embodiments. Insulating material 712 can be deposited using any known chemical or physical vapor deposition technique. In one example, insulating material 712 is aluminum oxide. After deposition, a top surface of insulating material 712 can be planarized using CMP.

Figures 7C, 7D:
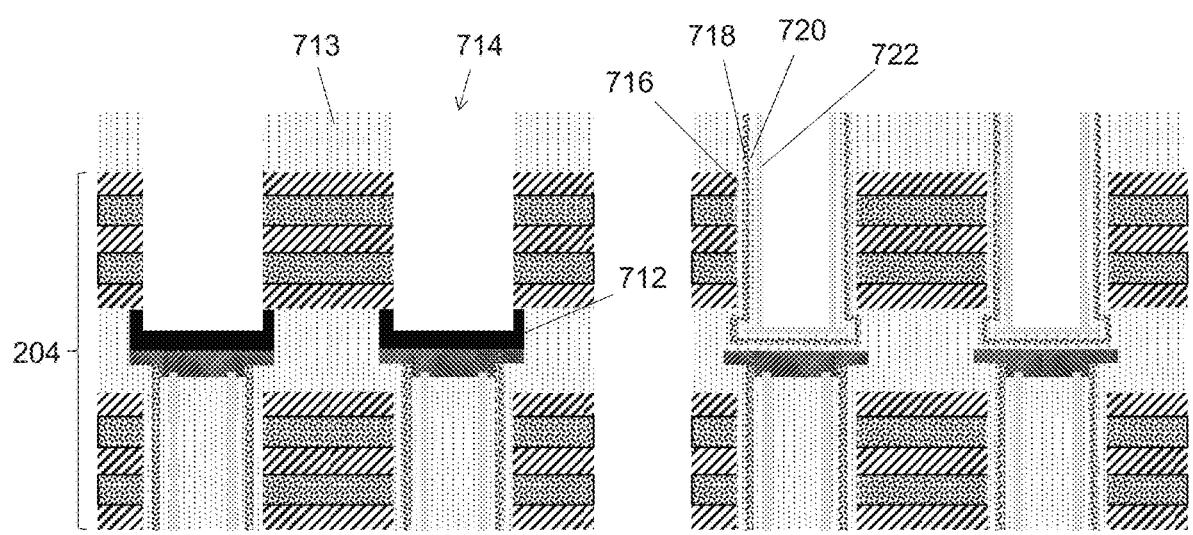

FIG. 7C illustrates the formation of additional layers of layer stack 204. In some embodiments, a top dielectric layer 713 is formed over layer stack 204. Openings 714 are formed through a top portion of layer stack 4204 and through a portion of insulating material 712. Openings 714 can be formed using DRIE. In this arrangement, insulating material 712 can act as an etch-stop material for the etching of openings 714, and can protect the underlying conductive material 702 from being etched by the formation of openings 714.

FIG. 7D illustrates the formation of memory layers of second vertical structures 212 within openings 714 after the removal of insulating material 712, according to some embodiments. For example, a first oxide layer 716, a nitride layer 718, a second oxide layer 720, and a semiconductor layer 722 are deposited, in the order listed, within openings 714. One or more of the memory layers also form along sidewalls of a groove at the bottom of openings 714 that is left behind after the removal of insulating material 712.

Figure 7E:
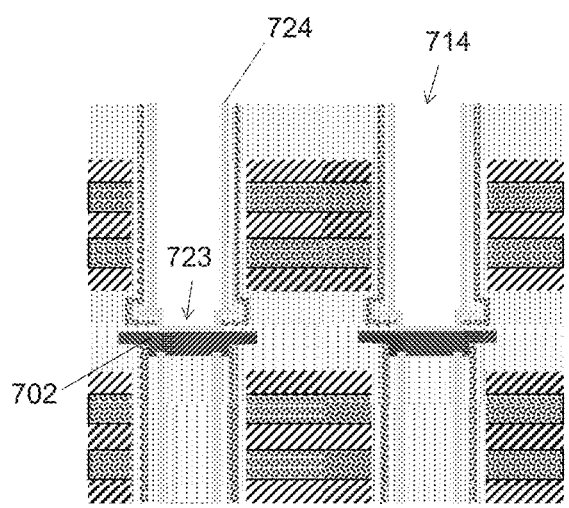

FIG. 7E illustrates an additional etching process to punch through the memory layers at the bottom of openings 714 to form nested recess 723, according to some embodiments. Semiconductor layer 722 is stripped away and re-deposited within nested recess 723 as semiconductor layer 724, according to some embodiments. Semiconductor layer 724 makes conductive contact with conductive material 702, and can be the same material as semiconductor layer 722.

Figure 7F:
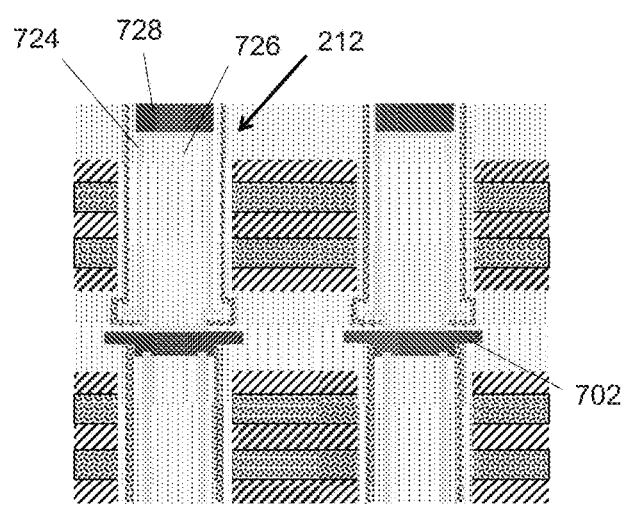

FIG. 7F illustrates the completion of the formation of second vertical structures 212, according to some embodiments. Specifically, a core insulator 726 is deposited to fill a remainder of openings 714, and subsequently recessed to provide space for depositing a top conductive material 728. Top conductive material 728 can include polysilicon. In some embodiments, top conductive material 728 is the same material as semiconductor layer 724. According to some embodiments, second vertical structures 212 are formed directly on a top surface of conductive material 702. Top conductive material 728 can be similarly doped as described above with respect to conductive material 618. In some embodiments, the dopants that are either diffused or implanted into top conductive material 728 do not extend through the entire thickness of top conductive material 728.

According to some embodiments, dopants from top conductive material 728 and conductive material 702 can diffuse into adjacent portions of semiconductor layer 724 of second vertical structures 212 and semiconductor layer 710 of first vertical structures 210. The diffusion can be aided by annealing the semiconductor structure at a high temperature between 750 and 950° C., for about 30 minutes.

Figure 8A:
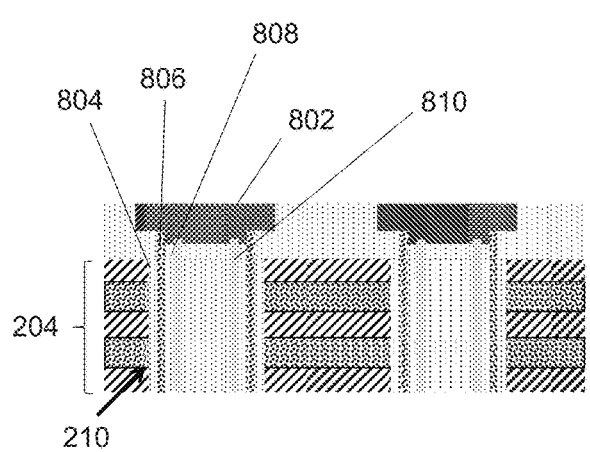

FIGS. 8A-8F illustrate cross sections of a semiconductor structure during a fabrication process, according to a third embodiment. FIG. 8A illustrates first vertical structures 210 extending through layer stack 204 and having a plurality of memory layers including a first oxide layer 804, a nitride layer 806, a second oxide layer 808, and a semiconductor layer 810. FIG. 8A illustrates a fabrication stage similar to that illustrated in FIG. 6D, and thus each of the operations discussed from FIG. 6A-6D are similarly performed to form a conductive material 802 filling recesses at the top portions of first vertical structures 210. Conductive material 802 can be polysilicon, and can have properties similar to that of conductive material 618 described in FIGS. 6D-6F.

Figure 8B:
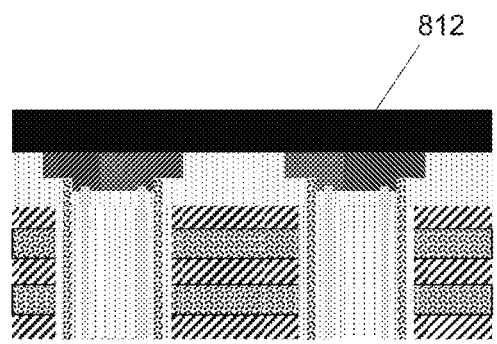

FIG. 8B illustrates the deposition of an insulating layer 812 over layer stack 204 and on a top surface of conductive material 802. Insulating layer 812 can be deposited using any known chemical or physical vapor deposition technique. In one example, insulating layer 812 is aluminum oxide. After deposition, a top surface of insulating layer 812 can be planarized using CMP.

FIG. 8C illustrates the formation of additional layers of layer stack 204. In some embodiments, a top dielectric layer 813 is formed over layer stack 204. Openings 814 are formed through a top portion of layer stack 204 and through a portion of insulating layer 812. Openings 814 can be formed using DRIE. In this arrangement, insulating layer 812 can act as an etch-stop material for the etching of openings 814, and can protect the underlying conductive material 802 from being etched by the formation of openings 814.

FIG. 8D illustrates the removal of a portion of insulating layer 812 from the bottom of openings 814, according to some embodiments. Portions of insulating layer 812 can be removed using standard wet etchants such that lateral portions of insulating layer 812 are etched beneath top layers of layer stack 204. Insulating layer 812 can be etched until a significant portion of a top surface of conductive material 802 is exposed. Removing the portions of insulating layer 812 creates a groove 816 at the lower end of openings 814, according to some embodiments. Other portions of insulating layer 812 remain between adjacent openings 814, according to some embodiments.

Figure 8E:
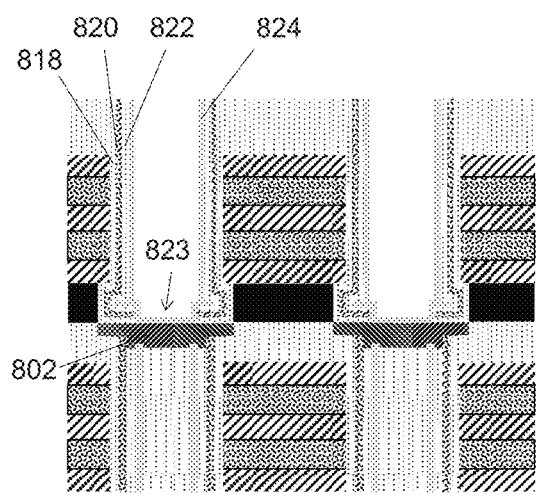

FIG. 8E illustrates the formation of memory layers of second vertical structures 212 within openings 814 after the removal of the portions of insulating layer 812, according to some embodiments. For example, a first oxide layer 818, a nitride layer 820, a second oxide layer 822, and a semiconductor layer 824 are deposited, in the order listed, within openings 814. Each of the memory layers also form along sidewalls of groove 816 at the bottom of openings 814 that is left behind after the removal of the portions of insulating layer 812.

An additional etching process can be performed to punch through the memory layers at the bottom of openings 814 to form nested recess 823, according to some embodiments. Semiconductor layer 824 is stripped away and re-deposited within nested recess 823, according to some embodiments. Semiconductor layer 824 makes conductive contact with conductive material 802.

Figure 8F:
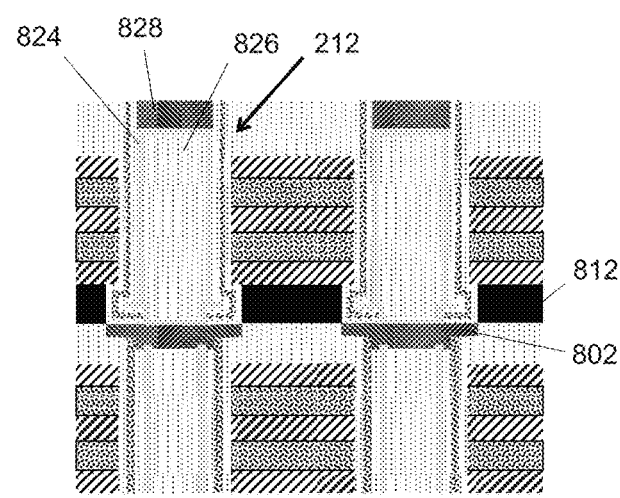

FIG. 8F illustrates the completion of the formation of second vertical structures 212, according to some embodiments. Specifically, a core insulator 826 is deposited to fill a remainder of openings 814, and subsequently recessed to provide space for depositing a top conductive material 828. Top conductive material 828 can include polysilicon. In some embodiments, top conductive material 828 is the same material as semiconductor layer 824. According to some embodiments, second vertical structures 408 are formed directly on a top surface of conductive material 802. Top conductive material 828 can be similarly doped as described above with respect to conductive material 618. In some embodiments, the dopants that are either diffused or implanted into top conductive material 828 do not extend through the entire thickness of top conductive material 828.

According to some embodiments, dopants from top conductive material 828 and conductive material 802 can diffuse into adjacent portions of semiconductor layer 824 of second vertical structures 212 and semiconductor layer 810 of first vertical structures 210. The diffusion can be aided by annealing the semiconductor structure at a high temperature between 750 and 950° C., for about 30 minutes.

Figure 9:
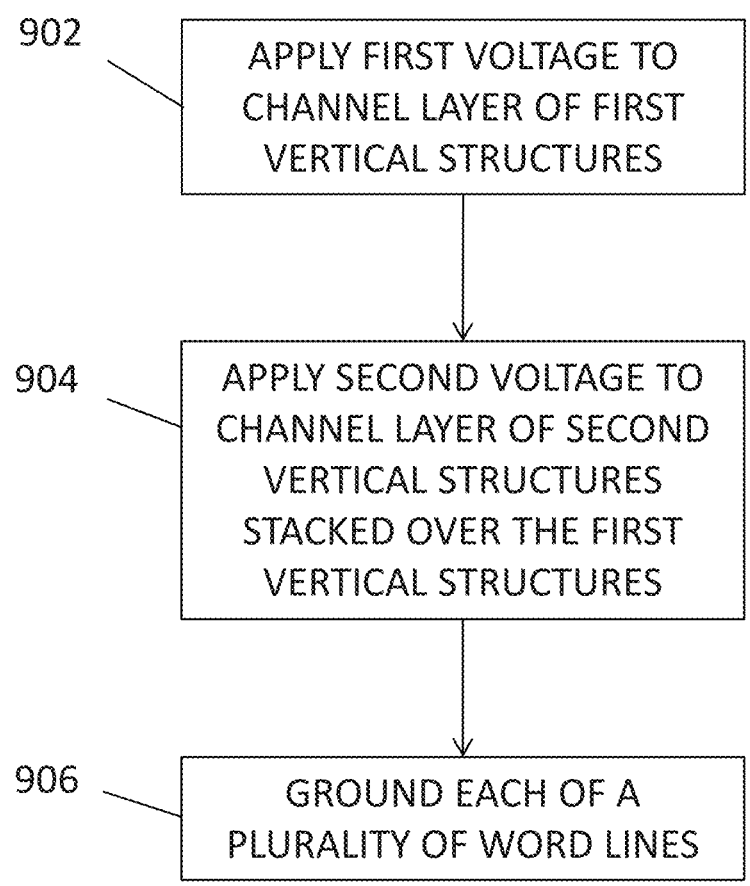
FIG. 9 is an illustration of a method of operating a three-dimensional memory structure, according to some embodiments.

FIG. 9 is a flowchart of an exemplary method 900 of performing an erase procedure of a NAND memory device, according to some embodiments. It should be understood that the operations shown in method 900 are not exhaustive and that other operations can be performed as well before, after, or between any of the illustrated operations. In various embodiments of the present disclosure, the operations of method 900 can be performed in a different order and/or vary.

In operation 902, a first voltage is applied to the semiconductor channel layer of a plurality of first vertical structures. The plurality of first vertical structures can be NAND strings formed through a layer stack containing a plurality of conductive word lines. The first voltage can be applied to a semiconductor substrate that is in conductive contact with the channel layer of the plurality of first vertical structures. In another example, the voltage can be applied to a conductive contact that extends through the layer stack and contacts the substrate in order to apply the voltage to the channel layer of the plurality of first vertical structures. The first voltage can be greater than 10 V. In some embodiments, the first voltage ranges from 12 V to 27 V. In one example, the first voltage is about 15 V.

In operation 904, a second voltage is applied to the semiconductor channel layer of a plurality of second vertical structures. The plurality of second vertical structures are stacked over the plurality of first vertical structures having a conductive material sandwiched between them. The plurality of second vertical structures can be NAND strings formed through the layer stack containing a plurality of conductive word lines. The second voltage can be applied to a conductive material disposed over the plurality of second vertical structures, the conductive material being in conductive contact with the channel layer of the plurality of second vertical structures. The second voltage can be greater than 10 V. In some embodiments, the second voltage ranges from 12 V to 27 V. In one example, the second voltage is about 15 V.

In operation 906, each of the plurality of word lines of the layer stack is electrically grounded. The strong E-field drives holes into the charge trap layer of each of the first plurality of vertical structures and the second plurality of vertical structures in order to "erase" any charge trapped in the charge trap layer of each memory cell. A high voltage is applied to each of the plurality of first vertical structures and the plurality of second vertical structures because the hole current is interrupted by the presence of the n-type conductive material disposed between the plurality of first vertical structures and the plurality of second vertical structures.

Figure 10:
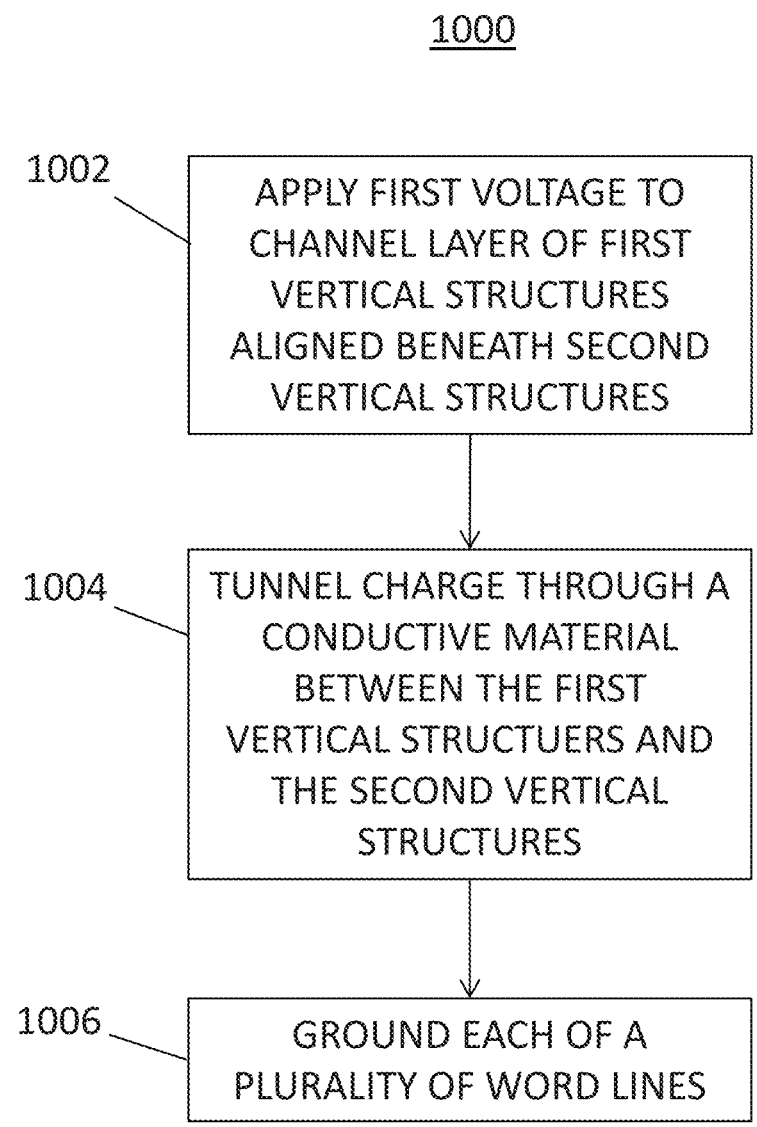
FIG. 10 is an illustration of another method of operating a three-dimensional memory structure, according to some embodiments.

FIG. 10 is a flowchart of another exemplary method 1000 of performing an erase procedure of a NAND memory device, according to some embodiments. It should be understood that the operations shown in method 1000 are not exhaustive and that other operations can be performed as well before, after, or between any of the illustrated operations. In various embodiments of the present disclosure, the operations of method 1000 can be performed in a different order and/or vary.

In operation 1002, a first voltage is applied to the semiconductor channel layer of a plurality of first vertical structures. The plurality of first vertical structures can be NAND strings formed through a layer stack containing a plurality of conductive word lines. A plurality of second vertical structures is disposed over the plurality of first vertical structures with a conductive material sandwiched between them. The plurality of second vertical structures can also be NAND strings formed through the layer stack containing the plurality of conductive word lines. The first voltage can be applied to a semiconductor substrate that is in conductive contact with the channel layer of the plurality of first vertical structures. In another example, the voltage can be applied to a conductive contact that extends through the layer stack and contacts the substrate in order to apply the voltage to the channel layer of the plurality of first vertical structures. The first voltage can be greater than 10 V. In some embodiments, the first voltage ranges from 12 V to 27 V. In one example, the first voltage is about 15 V.

In operation 1004, charges generated from the application of the first voltage tunnel through the conductive material between the first vertical structures and the second vertical structures such that charge builds up in the channel layers of both the first vertical structures and the second vertical structures. The holes are able to tunnel through the conductive material if the conductive material is thin enough and has a high doping concentration. For example, holes can tunnel through a conductive material having a thickness between about 15 nm and about 45 nm, and an n-type doping concentration greater than about $10^{19}$.

In operation 1006, each of the plurality of word lines of the layer stack is electrically grounded. The strong E-field drives holes into the charge trap layer of each of the first plurality of vertical structures and the second plurality of vertical structures in order to "erase" any charge trapped in the charge trap layer of each memory cell.

The present disclosure describes various embodiments of operating three-dimensional NAND memory devices. In some embodiments, a memory device includes one or more first vertical structures and one or more second vertical structures, the one or more second vertical structures aligned over corresponding ones of the one or more first vertical structures, and a conductive material disposed between the one or more first vertical structures and the one or more second vertical structures. A method of erasing memory cells of the memory device includes applying a first voltage greater than 10 V to a first semiconductor layer of the one or more first vertical structures. The method further includes applying a second voltage greater than 10 V to a second semiconductor layer of the one or more second vertical structures. The method also includes grounding each of a plurality of word lines. The plurality of word lines are arranged in an alternating stack with insulating layers over a substrate, and the one or more first vertical structures and the one or more second vertical structures extend through the alternating stack.

In some embodiments, a memory device includes one or more first vertical structures and one or more second vertical structures, the one or more second vertical structures aligned over corresponding ones of the one or more first vertical structures, and a conductive material disposed between the one or more first vertical structures and the one or more second vertical structures. A method of erasing memory cells of the memory device includes applying a voltage greater than 10 V to a first semiconductor layer of the one or more first vertical structures. Charges in the first semiconductor layer tunnel through the conductive material to reach a second semiconductor layer of the one or more second vertical structures. The method also includes grounding each of a plurality of word lines. The plurality of word lines are arranged in an alternating stack with insulating layers over a substrate, and the one or more first vertical structures and the one or more second vertical structures extend through the alternating stack.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of erasing memory cells of a memory device having one or more first vertical structures and one or more second vertical structures, the one or more second vertical structures aligned over corresponding ones of the one or more first vertical structures, and a conductive material disposed between the one or more first vertical structures and the one or more second vertical structures, the method comprising:
    applying a first voltage to a channel layer of the one or more first vertical structures;
    applying a second voltage to a channel layer of the one or more second vertical structures; and
    grounding each of a plurality of word lines, wherein the plurality of word lines are arranged in an alternating stack with insulating layers over a substrate, and the one or more first vertical structures and the one or more second vertical structures extend through the alternating stack,
    wherein applying the first voltage and applying the second voltage respectively causes a first current to flow through the channel layer of the one or more first vertical structures and a second current different from the first current to flow through the channel layer of the one or more second vertical structures.

2. The method of claim 1, wherein applying the first voltage comprises applying a voltage between 12 V and 27 V.

3. The method of claim 1, wherein applying the second voltage comprises applying a voltage between 12 volts and 27 volts.

4. The method of claim 1, wherein applying the second voltage comprises applying the second voltage to a conductive material disposed at a top portion of the one or more second vertical structures, the conductive material being in conductive contact with the channel layer of the one or more second vertical structures.

5. The method of claim 1, wherein applying the first voltage comprises applying the first voltage to the substrate.

6. The method of claim 1, further comprising applying a third voltage to a select gate disposed above the plurality of word lines.

7. The method of claim 6, wherein applying the third voltage comprises applying a voltage between 3 V and 7 V.

8. The method of claim 1, wherein applying the first voltage comprises applying the first voltage to a conductive contact that extends through the alternating stack and abuts a doped portion of the substrate.

9. The method of claim 1, wherein the first current and the second current each do not flow through the conductive material disposed between the one or more first vertical structures and the one or more second vertical structures.

10. The method of claim 1, wherein the first current flows towards the plurality of word lines after flowing through the channel layer of the one or more first vertical structures.

11. The method of claim 1, wherein the second current flows towards the plurality of word lines after flowing through the channel layer of the one or more second vertical structures.

12. A method of erasing memory cells of a memory device having one or more first vertical structures and one or more second vertical structures, the one or more second vertical structures aligned over corresponding ones of the one or more first vertical structures, and a conductive material disposed between the one or more first vertical structures and the one or more second vertical structures, the method comprising:
    applying a voltage to a channel layer of the one or more first vertical structures, wherein charges in the channel layer of the one or more first vertical structures tunnel through the conductive material to reach a channel layer of the one or more second vertical structures; and
    grounding each of a plurality of word lines, wherein the plurality of word lines are arranged in an alternating stack with insulating layers over a substrate, and the one or more first vertical structures and the one or more second vertical structures extend through the alternating stack.

13. The method of claim 12, wherein applying the voltage comprises applying a voltage between 12 V and 27 V.

14. The method of claim 12, wherein applying the voltage comprises applying the voltage to the substrate.

15. The method of claim 12, wherein applying the voltage comprises applying the voltage to a conductive contact that extends through the alternating stack and abuts a doped portion of the substrate.

16. The method of claim 12, wherein the conductive material is formed having a thickness between 15 nm and 45 nm.

17. The method of claim 12, wherein the conductive material is doped with n-type dopants at a concentration of at least $10^{19}$.

18. The method of claim 12, wherein applying the voltage causes a current to flow through the channel layer of the one or more first vertical structures and the channel layer of the one or more second vertical structures.

19. The method of claim 18, wherein the current flows towards the plurality of word lines after flowing through the channel layer of the one or more first vertical structures or the channel layer of the one or more second vertical structures.

\* \* \* \* \*